United States Patent [19]

Kamikawara

[11] Patent Number: 4,683,386
[45] Date of Patent: Jul. 28, 1987

[54] ELECTRONIC ATTENUATION VALUE CONTROL CIRCUIT IN WHICH SWITCHING NOISE IS SUPPRESSED

[75] Inventor: Toshio Kamikawara, Tokyo, Japan

[73] Assignee: NEC Corporation, Tokyo, Japan

[21] Appl. No.: 634,693

[22] Filed: Jul. 26, 1984

[30] Foreign Application Priority Data

Jul. 26, 1983 [JP] Japan .................................. 58-136102

[51] Int. Cl.⁴ .................... H03K 17/16; H03K 17/693; H03H 7/24
[52] U.S. Cl. ...................................... 307/549; 307/243; 307/550; 307/585; 333/81 R; 455/219; 455/194
[58] Field of Search ............... 307/243, 542, 550, 568, 307/571, 572, 577, 579, 585, 549; 333/81 R; 455/174, 194, 212, 222, 219, 225, 278

[56] References Cited

U.S. PATENT DOCUMENTS

| | | | |
|---|---|---|---|
| 3,229,218 | 1/1966 | Sickles, II et al. | 307/577 |
| 3,806,820 | 4/1974 | Uchiyama | 455/219 |
| 3,866,064 | 2/1975 | Gregory et al. | 307/585 |
| 4,121,183 | 10/1978 | Murphy | 307/542 |
| 4,529,897 | 7/1985 | Suzuki et al. | 307/571 |

*Primary Examiner*—John Zazworsky
*Attorney, Agent, or Firm*—Burns, Doane, Swecker & Mathis

[57] ABSTRACT

A digital controlled volume attenuator includes a plurality of resistors connected in series between a signal input terminal and a reference potential point and a plurality of electronic switches having one ends respectively connected to the connection points among resistors and the other ends connected in common. One of signals at the respective connection points among resistors is selected by making either one of the switches conductive to control the volume. A muting circuit is provided between a signal output terminal and the common connection point of the switches to prevent the switching noise generated by the switches from being supplied to the signal output terminal.

10 Claims, 7 Drawing Figures

| FIG. 5 |
|---|
| FIG. 5A |
| FIG. 5B |

ELECTRONIC ATTENUATION VALUE CONTROL CIRCUIT IN WHICH SWITCHING NOISE IS SUPPRESSED

BACKGROUND OF THE INVENTION

1. Field of the Invention

The present invention relates to an electronic attenuation value control circuit in which semiconductor devices are substituted for mechanical components, and more particularly to an electronic volume control circuit used in a television receiver, a radio receiver, an audio set, etc.

2. Description of the Prior Art

An electronic attenuation value control circuit using semiconductor devices has been employed in place of a mechanical attenuation value control circuit constituted by a variable resistor or a mechanical switch. The electronic attenuation value control circuit has a string of resistors and a plurality of electronic switches which are fabricated in a semiconductor integrated circuit device. The respective resistors are made of, for example, a polycrystalline semiconductor layer formed on a semiconductor substrate, and each of electronic switches is composed of transistors formed in the substrate. The string of resistors is connected between a signal input terminal and a reference potential point (a ground point, for example). The signal input terminal is supplied with an analog signal such as an audio signal. Accordingly, the attenuated signals of the analog signal appear at the respective interconnection point of resistors in accordance with the resistance ratio of the respective resistors. Each of the interconnection points of the resistors is connected to one end of the respective electronic switches. The other ends of the switches are connected in common to a signal output terminal. As a result, by making either one of the electronic switches conductive, the attenuated signal is derived from the signal output terminal, and the volume from a loudspeaker is changed.

It will be easily understood that the electronic attenuation value control circuit employed in a hi-fi audio set is required to produce the attenuated signal with a low distortion and to realize a sufficiently low switch-on resistance and a very high switch-off resistance of the respective electronic switches. For these purposes, each of the electronic switches has first and second transistors connected in parallel. These transistors are IG-FET's (Insulated Gate Field Effect Transistor) such as MOS (Metal-Oxide-Semiconductor) transistors having different conductivity types from each other. The first transistor has a channel region which is a surface portion of a semiconductor substrate of one conductivity type, whereas the second transistor has another channel region which is formed at the surface portion of the substrate as so-called "well region" of the opposite conductivity type to that of the substrate. Bias voltages are usually applied to the substrate and the well region to reverse-bias the p-n junction of the source and drain regions of the respective transistors. The first and second transistors are made conductive by supplying voltages having different polarities and being higher than threshold voltages of the respective transistors to their gates, so that the electronic switch takes an on-state. However, since the analog signal is transmitted through the switch, the difference occurs between the potential at the source or drain and the potential at the channel region in the respective transistors. Further, the voltage difference is changed. For this reason, the so-called "back-bias effect" occurs to change the threshold voltage of the transistor. Thus, the threshold voltage is varied in response to the potential at the channel region, and so this region is called as "back-gate". In contrast to the back-gate, the gate electrode of the transistor is called "front-gate". When the threshold voltage is changed by the back-bias effect, the transconductance of the transistor is varied. As a result, the distortion of the analog signal is deteriorated. A control circuit is also formed in the semiconductor substrate for selecting either one of the electronic switches, and some transistors in the control circuit has other surface portions of the substrate as their channel forming region. Therefore, it is impossible that the bias voltage to the substrate is changed. On the other hand, the well region in which the second transistor is formed can be formed separately from other well regions. In other words, the back-gate of the second transistor can be connected to one end or the other end of the switch. Consequently, the potential at the back-gate of the second transistor is made equal to that at the source or drain of the same, and the back-bias effect is suppressed to reduce the deterioration in the distortion characteristic of the analog signal. If the back-gate of the second transistor, i.e., the well region is maintained to be connected to one or the other end of the switch, it is also subjected in a switch-off state to the potential change in accordance with the level variation of the analog signal. For this reason, the second transistor cannot be made nonconducting perfectly. In order to eliminate this shortcoming, the back-gate of the second transistor is connected in the switch-off state to a potential point that deeply reverse-biases the p-n junctions of the source and drain of the second transistor.

As described above, each of the electronic switches is composed of the first and second transistors of the different conductivity types from each other, and further has a back-gate control circuit which switches over the potential applied to the back-gate of the second transistor in the switch-on state and the switch-off state. Accordingly, such an electronic switch has a sufficiently low switch-on resistance and a very high switch-off resistance, and suppresses the deterioration in distortion of the analog signal transmitted therethrough. The electronic volume control circuit using the above-mentioned switches is applicable to the hi-fi audio set.

However, the change in the voltage at the back-gate of the second transistor is differentiated by the p-n junction capacitance or the stray capacitance in the transistor. Consequently, a noise voltage in a pulse shape appears at the other end of the switch. The other ends of the electronic switches are connected in common to the signal output terminal. Further, the conductive states of two parallel-connected electronic switches are switched over when the attenuation value is changed. For this reason, a noise signal having a relatively large level is produced at the signal output terminal every time when the attenuation value is changed. Since the state of the electronic switch is changed over instantaneously, the frequency of the noise signal is considerably higher than the audio frequency. Accordingly, the change in level at the signal output terminal caused by the noise signal may be mitigated by using a low-pass filter, for example. However, the voltage level of the noise signal is considerably large, the signal output terminal takes a relatively high potential change. The potential change at the output terminal is further amplified by a power amplifier of the next stage, so that a pop noise is generated by a loudspeaker. The speaker or other signal processing circuits may be destroyed by the noise signal.

SUMMARY OF THE INVENTION

It is, therefore, one object of the present invention is to provide an improved electronic attenuation value control circuit.

Another object of the present invention is to provide a circuit which suppresses a change in potential at a signal output terminal upon the variation of attenuation volume.

It is still another object of the present invention to provide a digital controlled signal attenuater in which a noise caused by the change of the state of an electronic switch is prevented from being supplied to a next stage.

A circuit according to the present invention comprises an input terminal supplied with a input signal, a plurality of resistors connected in series between the input terminal and a reference potential point to produce a plurality of signals each relative to the input signal from the respective interconnection points of the resistors, a plurality of switching circuits each having one end supplied with different one of the signals, the other ends of the switching circuits being connected in common, each of the switching circuits transmitting the signal supplied to its one end to the common connection point along with a switching noise, a signal output terminal, and a muting circuit coupled between the common connection point and the signal output terminal and preventing the switching noise from appearing at the signal output terminal.

Since the muting circuit is provided between the switching circuits and the signal output terminal, the switching noise generated from the switching circuit is prevented from appearing at the signal output terminal. Therefore, the change in potential at the output terminal is suppressed, which would be otherwise very large by the switching noise from the switching circuit. As a result, a loudspeaker receiving the signal from the signal output terminal does not produce a pop noise. Even if the pop noise is produced, its sound is extremely small.

It is favorable that the muting circuit includes means for connecting the common connection point of the switching circuits to the signal output terminal and an additional switching circuit coupled between the signal output terminal and a reference potential point. The additional switching circuit is turned on when the switching circuits are switched over. In other words, the potential at the signal output terminal is clamped to the potential at the reference potential point by the additional switching circuit when the switching circuits are switched over to change the volume. Therefore, the switching noise generated from the respective switching circuits does not appear at the signal output terminal. In addition, the additional switching circuit is not provided in series in a signal transmission path, and hence it does not deteriorate the distortion characteristics of the input signal.

BRIEF DESCRIPTION OF THE DRAWINGS

The above and other objects, features and advantages of the present invention will be more apparent from the following description taken in conjunction with the accompanying drawings, in which.

DETAILED DESCRIPTION OF THE PREFERRED EMBODIMENTS

Figure 1:
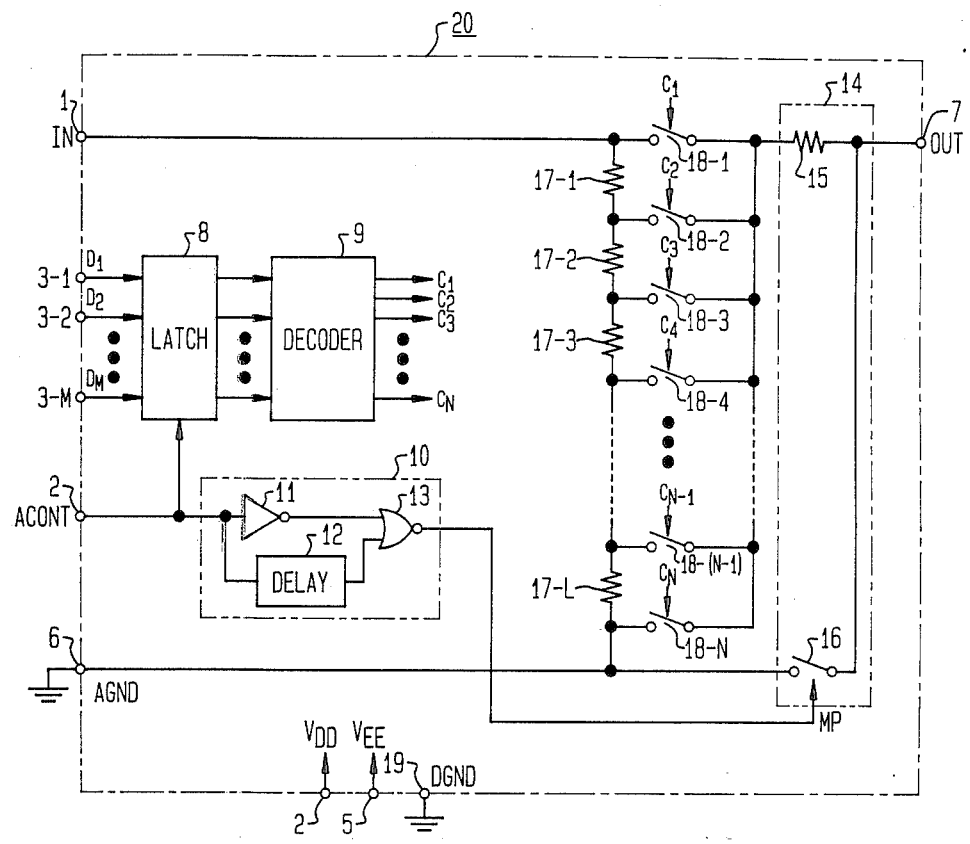
FIG. 1 is a circuit diagram showing one preferred embodiment of the present invention.

Referring now to FIG. 1, there is shown an electronic attenuation value control circuit (or digital controlled signal attenuator) according to one embodiment of the present invention as an integrated circuit device 20. An analog signal such as an audio signal is supplied between a signal input (IN) terminal 1 and an analog ground (AGND) terminal 6. The terminals 1 and 6 are connected to the output and ground terminals of a preceding analog circuit (not shown), respectively. A plurality of resistors 17-1 to 17-L is connected in series between the IN terminal 1 and AGND terminal 6. Accordingly, the resistors 17-1 to 17-L attenuate the analog signal supplied to the IN terminal 1 in accordance with the resistance ratio of the respective resistors, so that the attenuated signals appear at the respective interconnection points of the resistors. The resistors 17-1 to 17-L are made of a silicon polycrystalline layer formed on a silicon substrate in which circuit elements described hereinafter are formed. If desired, the resistors 17-1 to 17-L may be made of a diffusion resistor or a thin-film resistor. The device 20 is also provided with a ground terminal 19 (DGND) for a digital control circuit, whereby the mutual interference between the analog signal and the digital control signal is prevented. A plurality of electronic switches 18-1 to 18-N are provided for selecting the signal to be outputted, and their conductive states are controlled by switching control signals $C_1$ to $C_N$. First ends of the switches 18-1 and 18-N are connected to the IN terminal 1 and AGND terminal 6, respectively. First ends of the switches 18-2 to 18-(N-1) are connected to the connection points among the resistors 17-1 to 17-L, respectively. Second ends of the switches 18-1 to 18-N are connected in common to a node $N_1$. When the switch 18-1 takes an on-state, the analog signal from the IN terminal 1 appears at the node $N_1$ without a level attenuation. The signal determined by the ratio between the total resistance of the resistors 17-1 to 17-3 and that of the resistors 17-4 to 17-L appears at the node $N_1$ when the switch 18-4 is made conductive. If the switch 18-N takes an on-state, the ground potential appears at the node $N_1$. That is, no analog signal is outputted.

Figure 2:
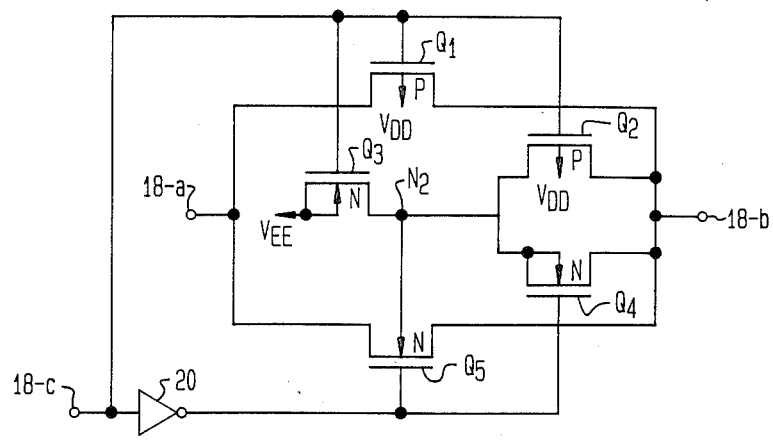
FIG. 2 is a circuit diagram showing an analog switch employed in FIGS. 1, 5A, and 5B.

As shown in FIG. 2, each of the electronic switches 18-1 to 18-N is constructed by two P-channel MOS transistors $Q_1$ and $Q_2$, three N-channel MOS transistors $Q_3$ to $Q_5$, and an inverter 200, and has a terminal 18-$a$ supplied with the analog signal, a terminal 18-$b$ connected to the node $N_1$, and a control terminal 18-$c$ supplied with the switching control signal C. The transistors $Q_1$ and $Q_5$ are connected in parallel between the terminal 18-$a$ and 18-$b$. The terminal 18-$c$ is connected to the gate (front-gate) of the transistor $Q_1$, and further connected through the inverter 200 to the gate of the transistor $Q_5$. The back-gate of the transistor $Q_1$ is connected to a positive voltage supply terminal 4 (FIG. 1) provided in the device 20 to receive $V_{DD}$ voltage (+15 V). The back-gate of the transistor $Q_5$ is connected to a node $N_2$. The transistors $Q_2$ and $Q_4$ are connected in parallel between the node $N_2$ and terminal 18-b. The transistor $Q_3$ is connected between the node $N_2$ and a negative voltage supply terminal 5 (FIG. 1). $V_{EE}$ voltage (−15 V) is supplied to the terminal 5. The gates of the transistors $Q_2$ and $Q_3$ are connected to the gate of the transistor $Q_1$, and the gates of the transistors $Q_4$ and $Q_5$ are connected in common.

When the control signal C supplied to the terminal 18-c takes a low level, the transistors $Q_1$ and $Q_5$ are made conductive. Accordingly, the signal at the terminal 18-a appears at the terminal 18-b. At this time, since the transistors $Q_2$ and $Q_4$ are made conducting and the transistor $Q_3$ is made nonconducting, the node $N_2$, i.e., the back-gate of the transistor $Q_5$ is connected to the terminal 18-b. Therefore the potential at the back-gate of the transistor $Q_5$ is made equal to that at its drain (or source), so that the back-bias effect in the transistor $Q_5$ is suppressed to remarkably reduce the deterioration in the distortion characteristic of the signal appearing at the terminal 18-b. Further, the switch-on resistance is sufficiently small. When the switching control signal C is inverted to a high level, the transistors $Q_1$ and $Q_5$ are turned off. Consequently, the signal at the terminal 18-a does not appear at the terminal 18-b. Simultaneously, the transistors $Q_2$ and $Q_4$ are made nonconducting and the transistor $Q_3$ is made conductive. The back-gate of the transistor $Q_5$ is connected to the $V_{EE}$ terminal 5 to receive the negative voltage (−15 V). Accordingly, the transistor $Q_5$ is made nonconductive perfectly, so that the switch-off resistance becomes very high. The transistors $Q_2$ to $Q_4$ control the potential at the back-gate of the transistor $Q_5$ in response to the switch-on and switch-off states, and thus constitute a back-gate control circuit.

Turning back to FIG. 1, the switching control signals $C_1$ to $C_N$ for controlling the conductive state of the respective electronic switches 18-1 to 18-N are generated by a decoder circuit 9. The decoder 9 makes either one of the switching control signals $C_1$ to $C_N$ in response to data signals supplied through a latch circuit 8 from attenuation data set terminals 3-1 to 3-M ($D_1$ to $D_M$). By the switching control signal taking a low level, eigher one of the switches 18-1 to 18-N is made on as described in FIG. 2. The latch circuit 8 takes in and latches the data signals $D_1$ to $D_M$ when an attenuation control signal from an attenuation control (ACONT) terminal 2 takes a high level.

The analog signal appearing at the node $N_1$ by the on-state of one of the switches 18-1 to 18-N is supplied to a signal output (OUT) terminal 7 through a muting circuit 14. The OUT terminal 7 may be coupled to a loudspeaker through a succeeding state such as a power amplifier. The muting circuit 14 includes a resistor 15 and a muting switch 16. The resistor 15 is connected between the node $N_1$ and the OUT terminal 7. The switch 16 is connected between the AGND terminal 6 and the OUT terminal 7, and its conductive state is controlled by a muting pulse MP.

Figure 3:
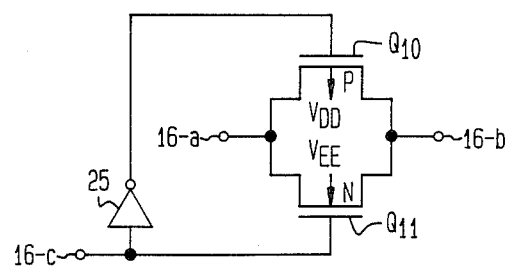
FIG. 3 is a circuit diagram showing a muting switch employed in FIGS. 1, 5A, and 5B.

As shown in FIG. 3, the muting switch 16 is composed of a P-channel MOS transistor $Q_{10}$, an N-channel MOS transistor $Q_{11}$ and an inverter 25, and has a terminal 16-a connected to the AGND terminal 6, a terminal 16-b connected to the OUT terminal 7 and a terminal 16-c supplied with the muting pulse MP. The transistors $Q_{10}$ and $Q_{11}$ are connected in parallel between the terminals 16-a and 16-b. The terminal 16-c is connected to the gate of the transistor $Q_{10}$ through the inverter 25, and further connected to the gate of the transistor $Q_{11}$. The back-gates of the transistors $Q_{10}$ and $Q_{11}$ are connected to the $V_{DD}$ and $V_{EE}$ terminals 4 and 5 to receive $V_{DD}$ voltage (+15) and $V_{EE}$ voltage (−15 V), respectively. When the muting pulse MP takes a high level, the transistors $Q_{10}$ and $Q_{11}$ are made conductive.

The muting pulse MP is produced by a muting pulse generator 10 in response to the attenuation control signal from the ACONT terminal 2, as shown in FIG. 1. The generator 10 includes an inverter 11, a delay circuit 12 and a NOR circuit 13. The input end of the inverter 11 is connected to the ACONT terminal 2, and its output end is connected to one input end of the NOR circuit 13. The delay circuit 12 is connected between the terminal 2 and the other input end of the NOR circuit 13. Accordingly, when the attenuation control signal takes a low level, the output of the NOR circuit 13, i.e., the muting pulse MP takes a low level, so that the muting switch 16 is in an off-state. When the attenuation control signal is inverted to a high level, the one input end of the NOR circuit 13 takes a low level. On the other hand, the other input end of the NOR circuit 13 is held at a low level. Therefore, the output of the NOR circuit 13 is inverted into a high level. The other input end of the NOR circuit 13 is takes a high level after a signal delay of the delay circuit 12, so that the output of the NOR circuit 13 is inverted into a low level. That is, the muting pulse MP is generated in synchronism with the inverting point from a low level to a high level of the attenuating control signal. The high level period of the pulse MP is determined by the delay time of the delay circuit 12. The muting switch 16 is turned on in response to the muting pulse MP to connect the OUT terminal 7 to the AGND terminal 6. The inversion from a low level to a high level of the attenuation control signal means that one of the switches 18-1 to 18-N is changed from on-state to off-state and another of them is changed from off-state to on-state. Accordingly, the noise signal caused by the change in the conductive states of two switches does not appear at the OUT terminal 7.

Figure 4:
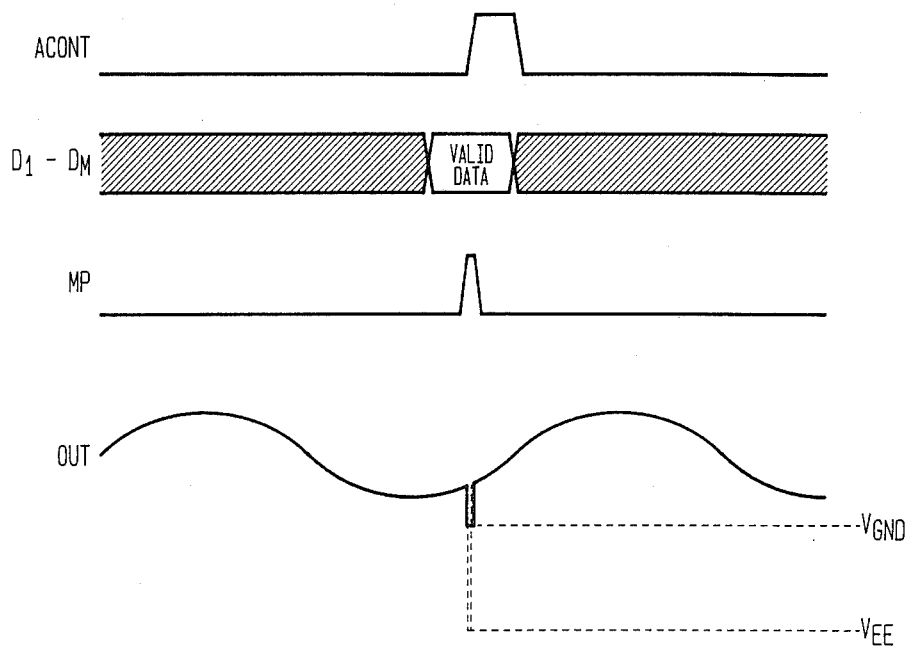
FIG. 4 shows signal waveforms of the circuit shown in FIG. 1.

With reference to FIG. 4, the muting operation will be described in more detail. Assuming that the switch 18-4 is in a on-state, the signal at the connection point between the resistors 17-3 and 17-4 is outputted from the OUT terminal 7. The loudspeaker coupled to the terminal 7 generates a sound corresponding to this signal. When the listener operates volume control key or keys provided on the set in order to increase volume, the key data are supplied to the terminals 3-1 to 3-M as volume control data $D_1$ to $D_M$. Further, the attenuation control signal supplied to the ACONT terminal 2 is inverted from a low level to a high level to change the volume, whereby the latch circuit 8 is enabled to take in and latch the volume data $D_1$ to $D_M$ supplied to the terminal 3-1 to 3-M. The decoder 9 inverts the control signal $C_4$ from low to high and the signal $C_3$ from high to low, respectively, in response to the latched data. Consequently, the switch 18-4 is changed from the on-state to off-state, and the switch 18-3 is changed from the off-state to on-state. At this time, the switching noise is generated from the respective switches 18-3 and 18-4. More specifically, as shown in FIG. 3, the back-gate of the transistor $Q_5$ in the switch 18-4 is connected to the $V_{EE}$ terminal 5 from the terminal 18-b, and that of the transistor Q$_5$ in the switch 18-3 is connected to the terminal 18-b from the V$_{EE}$ terminal 5. Consequently, the back-gate of the transistor Q$_5$ in the switches 18-3 and 18-4 is subjected to a large potential variation. This potential variation appears at the terminal 18-b through the capacitance of the p-n junction or the stray capacitance of the transistor Q$_5$. The voltage V$_{EE}$ applied to the terminal 5 has a considerably large level (−15 V) compared to the analog signal level in order to ensure the off-state of the transistor Q$_5$. For this reason, if the muting circuit 14 is not provided, the potential at the OUT terminal 7 would become far lower than the ground level as shown by dotted line in FIG. 4 by the switching noise from the switches 18-3 and 18-4 to supply the noise signal having a large level to the succeeding state coupled to the terminal 7. As a result, the relatively large pop noise would be generated from the loudspeaker.

This noise signal having the large level is prevented from being outputted from the OUT terminal 7 by the muting circuit 14. When the attenuation control signal is inverted into the high level from the low level, the muting pulse is generated from the muting pulse generator 10, as shown in FIG. 4. Therefore, the muting switch 16 is made on simultaneously with the change in the conductive states of the switches 18-3 and 18-4. Since the switch 16 has the simplified circuit construction and since the back-gates of the transistors Q$_{10}$ and Q$_{11}$ are fixed as shown in FIG. 3, the switching noise of the switch 16 is extremely small, but its switch-on resistance is higher than that of the switch shown in FIG. 2. In addition, the noise is generated at the node N$_1$ in response to the change in conductive states of the switch 18-3 and 18-4. However, the resistor 15 is connected between the node N$_1$ and OUT terminal 7 and has a resistance value (20 KΩ in this embodiment) which is considerably higher than the switch-on resistance of the switch 16. Accordingly, the OUT terminal 7 is substantially short-circuited to the AGND terminal 6, so that the potential at the OUT terminal 7 is held at the ground potential as shown in FIG. 4. In other words, the large change in potential caused by the switching noise is prevented by the muting circuit 14. When the muting switch 16 is returned to the off-state, the analog signal at the connection point between the resistors 17-2 and 17-3 appears at the node N$_1$. Since the resistor 15 is negligible compared to the switch-off resistance of the switch 16, the signal at the node N$_1$ is supplied to the OUT terminal 7 without a substantial loss. The high level period of the muting pulse MP, i.e., the on-period of the switch 16 is selected to about 1 μsec by the delay circuit 12. This time of period is sufficiently long in contrast with the generation period of the switching noise caused by the change in conductive states of the switches 18-3 and 18-4, and is too short for the listener to recognize the pause of the audio signal. The OUT terminal is subjected to the change in potential in response to the on-state of the switch 16, but this change in potential is small. Further, the on-period of the switch 16 is extremely short. Therefore, the pop noise is not almost generated from the speaker coupled to the OUT terminal 7.

One may consider that the muting switch 16 is connected between the node N$_1$ and the OUT terminal 7 and the switch 16 is turned off when two of the switches 18-1 to 18-N are switched over. In this case, the switching noise generated from the switches 18-1 to 18-N may not be appear at the OUT terminal 7. However, the switching noise generated from the muting switch 16 when turned on is supplied to the OUT terminal 7. In addition, since the switch 16 is inserted in series in the analog signal transmission path, it deteriorates the distortion characteristics of the analog signal. If the switch 16 is constructed as shown in FIG. 2, the deterioration in distortion of the analog caused by the switch 16 may be reduced, but the switch 16 generated a vary large switching noise, as described hereinbefore. For this reason, the OUT terminal 7 may be subject to a large potential variation to produce a pop noise.

Figures 5, 5B:
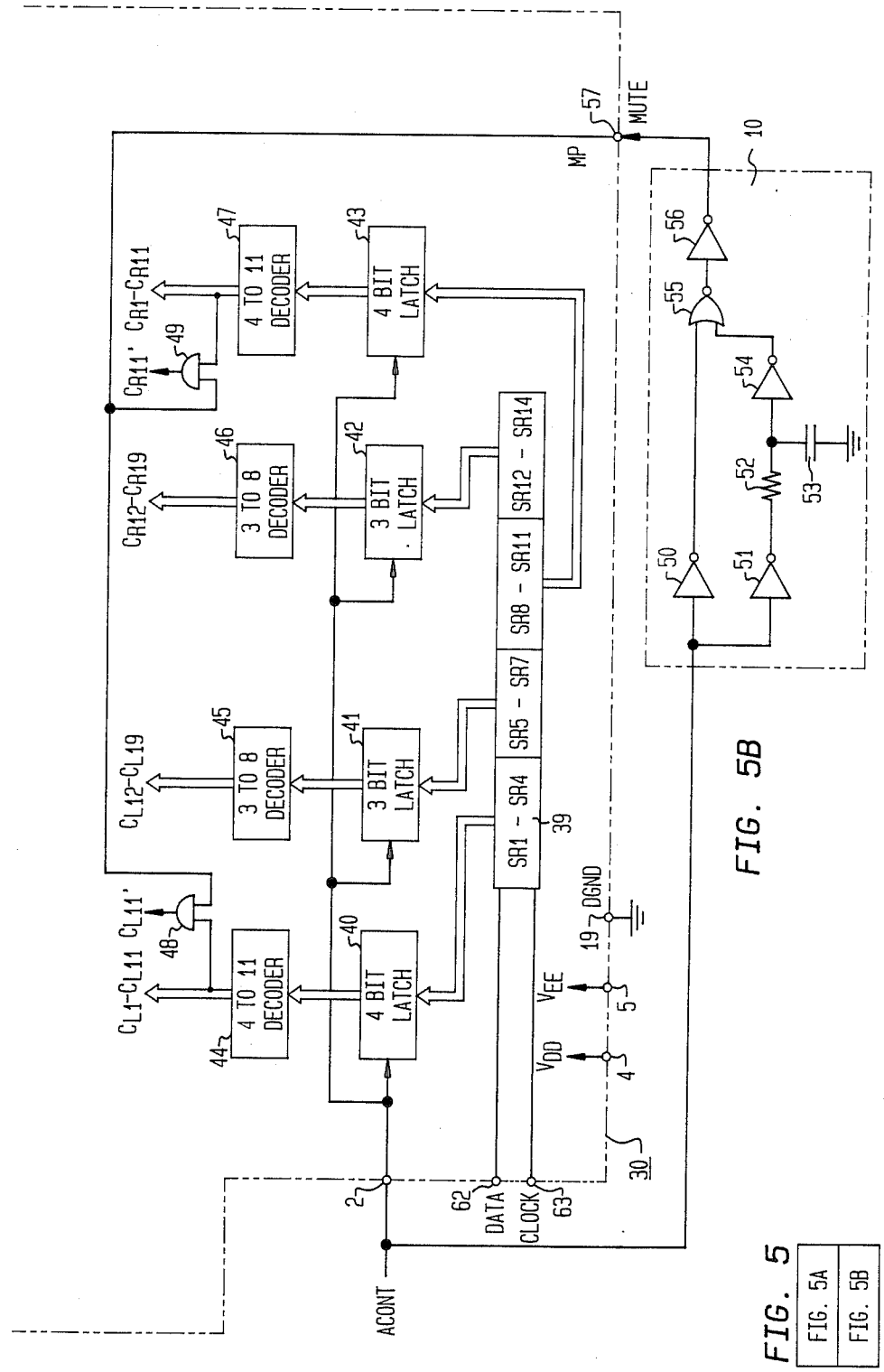
FIGS. 5A and 5B are circuit diagrams showing another preferred embodiment of the present invention.
Figure 5A:
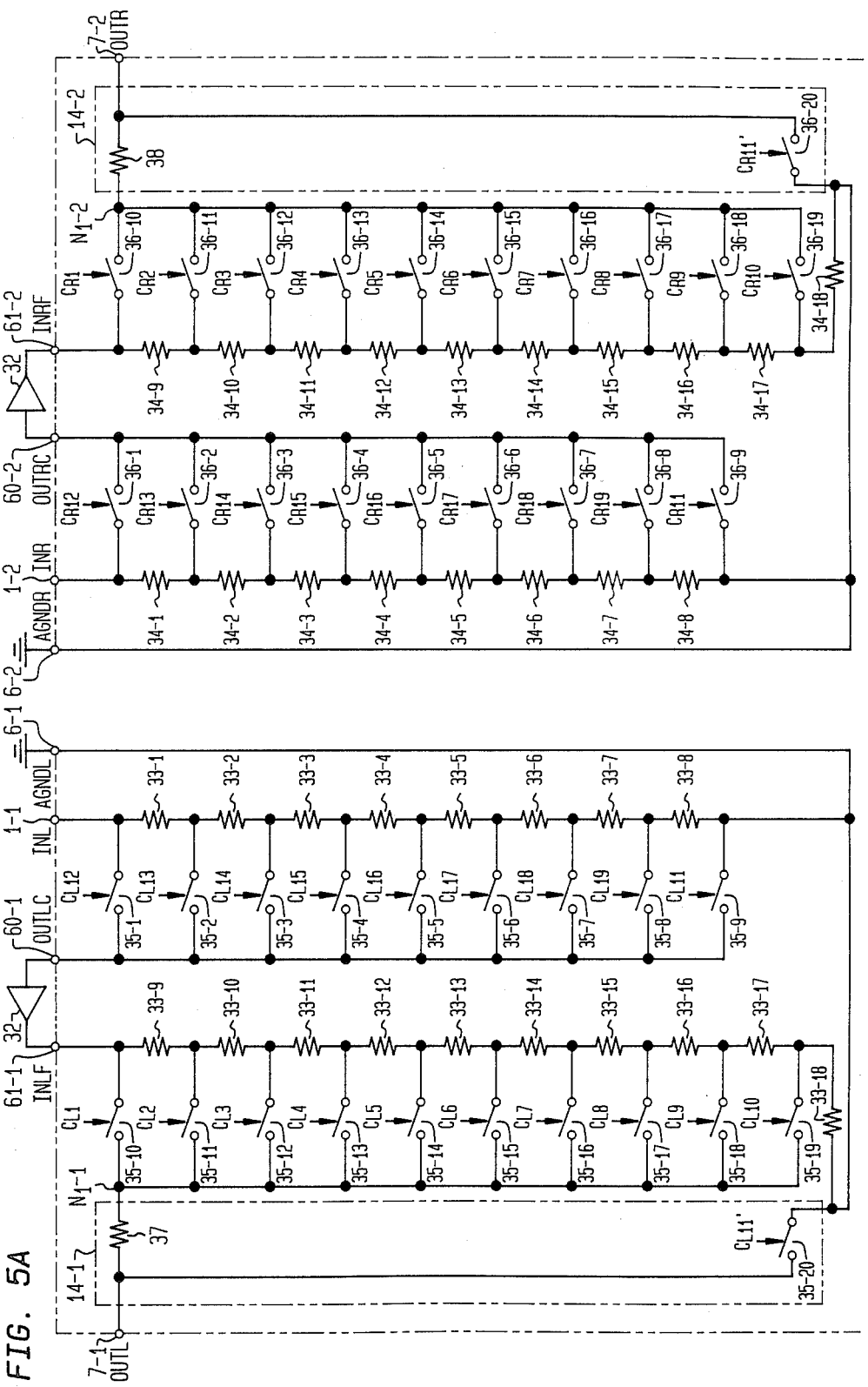

FIG. 5 shows another embodiment of the present invention in which a digital controlled signal attenuator is illustrated as an integrated circuit device 30. The same constituents as those shown in FIG. 1 are shown by the same reference numerals to omit their explanation. This digital controlled signal attenuator (or electronic volume control circuit) is used in a stereo set. Therefore, the device 30 is provided with left and right audio signal input terminals (INL and INR) 1-1 and 1-2, left and right ground terminals (AGNDL and AGNDR) 6-1 and 6-2, and left and right signal output terminals (OUTL and OUTR) 7-1 and 7-2. In addition, the signal attenuation circuit portion is divided into a coarse attenuation portion and a fine attenuation portion. The coarse attenuation portion in the left signal processing part is composed of eight resistors 33-1 to 33-8 connected in series between the INL terminal 1-1 and AGNDL terminal 6-1 and nine electronic switches 35-1 to 35-9. First ends of the switches 35-1 and 35-9 are connected to the INL and AGNDL terminals 1-1 and 6-1, respectively. First ends of the switches 35-2 to 35-8 are connected to the connection points of the resistors 33-1 to 33-8, respectively. Second ends of the switches 35-1 to 35-9 are connected is common to a coarse attenuation left output terminal (OUTLC) 60-1. The left audio signal supplied to the INL terminal 1 is attenuated −10 dB by −10 dB by the resistors 33-1 to 33-8. The switches 35-1 to 35-9 are controlled by switch control signals C$_{L12}$ to C$_{L19}$ and C$_{L11}$, respectively. The OUTLC terminal 60-1 is connected to a fine attenuation input (INLF) terminal 61-1 through a buffer amplifier 31 for the purpose of impedance matching between the coarse and fine attenuation portions. The fine attenuation portion in the left signal processing part is composed of ten resistors 33-9 to 33-18 connected in series between the INLF and AGNDL terminals 61-1 and 6-1, and eleven electronic switches 35-10 to 35-20. First ends of the switches 35-10 and 35-20 are connected to the INLF and AGNDL terminals 61-1 and 6-1, respectively. First ends of the switches 35-11 to 35-19 are connected to the connection points among the resistors 33-9 to 33-18, respectively. Second ends of the switches 35-10 to 35-19 are connected in common to a node N$_1$-1. A second end of the switch 35-20 is connected to the OUTL terminal 7-1. The signal appearing at the INLF terminal 61-1 through the coarse attenuation portion is further attenuated −1 dB by −1 dB by the resistors 33-9 to 33-18. The switches 35-10 to 35-20 are controlled by the switching control signals C$_{L1}$ to C$_{L11}'$, respectively. The signal appearing at the node N$_1$-1 is derived from the OUTL terminal 7-1 through a muting circuit 14-1. The circuit 14-1 includes a resistor 37 connected between the node N$_1$-1 and the OUTL terminal 7-1 and the switch 35-20. Accordingly, the switch 35-20 is used in common in the fine attenuation portion and muting circuit 14-1.

Similarly, the right signal processing part includes a coarse attenuation portion, a fine attenuation portion, a buffer amplifier 32 and a muting circuit 14-2. The coarse attenuation portion is composed of eight resistors 34-1 to 34-8 connected in series between the INR and AGNDR terminals 1-2 and 6-2, and nine electronic switches 36-1 to 36-9. The buffer amplifier 32 is connected between a coarse attenuation output (OUTRC) terminal 60-2 and a fine attenuation input (INRF) terminal 61-2. The fine attenuation portion is composed of ten resistors 34-9 to 34-19 connected in series between the INRF and AGNDR terminals 61-2 and 6-2 and eleven electronic switches 36-1 to 36-20. The signal appearing at a node $N_1$-2 is derived from the OUTR terminal 7-2 through the muting circuit 14-2 which has a resistors 38 connected between the node $N_1$-2 and the OUTR terminal 7-2 and the switch 36-20. The switch 36-20 is used in common for the fine attenuation portion and muting circuit 14-2. The switches 36-1 to 36-9 are controlled by switching control signals $C_{R12}$ to $C_{R19}$ and $C_{R11}$, respectively, and the switches 36-10 to 36-20 are controlled by switching control signals $C_{R1}$ to $C_{R11}'$, respectively.

The respective resistors 33-1 to 33-18 and 34-1 to 34-18 are made of a polycrystalline silicon layer formed on a silicon substrate in which the circuit elements shown in FIG. 5 are formed. Each of the electronic switches 35-1 to 35-19 and 36-1 to 36-19 has the same circuit construction as shown in FIG. 2 for suppressing the deterioration in distortion characteristics of the left and right audio signals and realizing a sufficiently low switch-on resistance and a very high switch-off resistance. However, the switches 35-20 and 36-20 used in common for the muting circuit and fine attenuation portion are composed of the simplified circuit construction shown in FIG. 3, but the inverter 25 is connected between the terminal 16-$c$ and the gate of the transistor $Q_{11}$ to be enabled by the low level at the terminal 16-$c$. The switching noises generated from the switches 35-20 and 36-20 are thus made sufficiently small. The switches 35-20 and 36-20 supply the ground level to the OUTL and OUTR terminals 7-1 and 7-2, respectively, and therefore it is allowable that the switch-on resistances of the switches 35-20 and 36-20 are higher than those of the switches 35-1 to 35-19 and 36-1 to 36-19. Since the switches 35-9 and 36-9 also supply the ground level to the OUTLC and OUTRC terminals 60-1 and 60-2, respectively, they can have the same construction as the switch 35-20.

The switching control signals $C_{L1}$ to $C_{L11}$ are generated from a 4 to 11 decoder 44. The decoder 44 makes either one of the signals $C_{L1}$ to $C_{L11}$ a low level in response to the latched data in a latch circuit 40. The switching control signal $C_{L11}$ is also supplied to one input and of an AND circuit 48 having the other input end supplied with a muting pulse MP from a muting terminal (MUTE) 57. The output of the AND circuit 48 serves as the switching control signal $C_{L11}'$ supplied to the electronic switch 35-20. When the switching control signal $C_{L11}$ is made the low level, the switches 35-9 and 35-20 are simultaneously brought into a switch-on state. When the muting pulse MP takes a low level, the switching control signal $C_{L11}'$ is inverted into a low level irrespective of the level of the signal $C_{L11}$, so that the switch 35-20 is made on-state. The switching control signals $C_{L12}$ to $C_{L19}$ for the switches 35-1 to 35-8 are generated from a 3 to 8 decoder 45. The decoder 45 invertes either one of the signals $C_{L12}$ to $C_{L19}$ into a low level in response to the latched data in a latch circuit 41, so that either one of the switches 35-2 to 35-8 is made conductive.

A 3 to 8 decoder 46 makes either one of the switching control signals $C_{R12}$ to $C_{R19}$ a low level in response to the latched data in a latch circuit 42. The switching control signals $C_{R1}$ to $C_{R11}$ are generated from a 4 to 11 decoder 47, and one of which is inverted into a low level by the decoder 47 in response to the latched data in a latch circuit 43. The switching control signal $C_{R11}$ is also supplied to one input and of an AND circuit 49. The other input end of the AND circuit is supplied with the muting pulse MP, and its output is supplied to the switch 36-20 as the switching control signal $C_{R11}'$. Therefore, when the muting pulse MP takes a low level, the switch 36-20 is brought into a on-state respective of the level of the signal $C_{R11}$.

Figure 6:
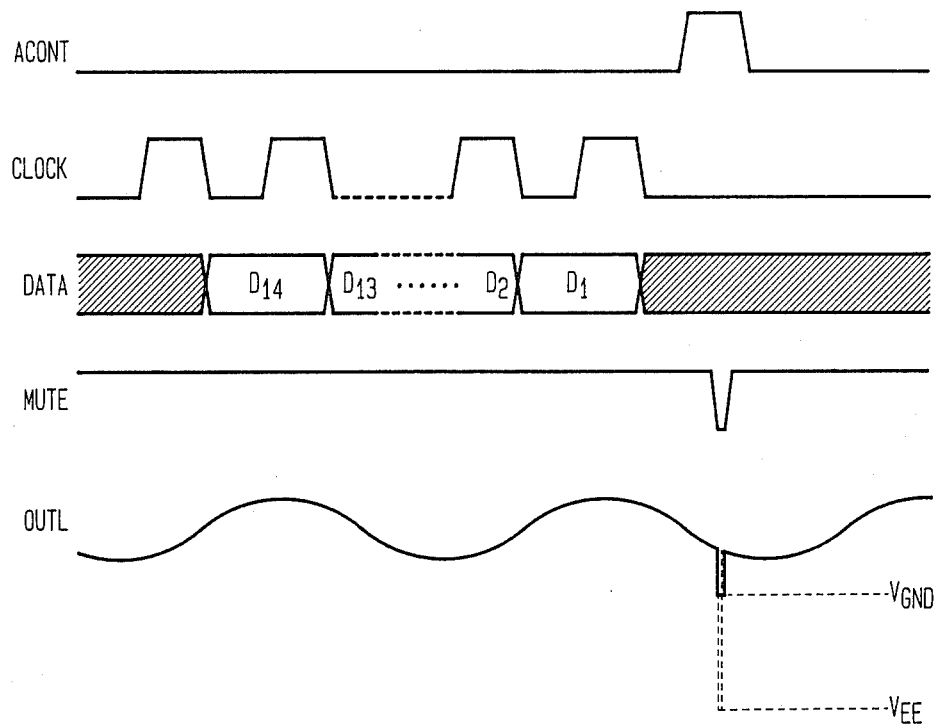
FIG. 6 shows signal waveforms of the circuit shown in FIGS 5A and 5B.

The attenuation control data (or volume control data) are generated in response to a volume control key (not show) operated by the listener, and serially supplied through a data input terminal (DATA) 62 to a shift-register 39 consisting of fourteen stages SR1 to SR14 in synchronism with a clock signal applied to a clock input terminal (CLOCK) 63. More specifically, as shown in FIG. 6, the shift-register 39 is enabled by the clock signal applied to the CLOCK terminal 63, and the data which is supplied to the DATA terminal 62 when the clock signal takes a high level is shifted from the first stage SR1 to the fourteenth stage SR14 in that order. Consequently, the first supplied data is stored in the fourteenth stage SR14 as the data D14, and the last supplied data is stored in the first stage SR1.

The data stored in the first to fourth stages SR1 to SR4 are supplied to the 4-bit latch circuit 40, and the data stored in the fifth to seventh stages SR5 to SR7 are supplied to the 3-bit latch circuit 41. The 3-bit latch circuit 42 receives the data stored in the twelfth to fourteenth stages SR12 to SR14, and the 4-bit latch circuit 43 receives the data stored in the eighth to eleventh stages SR8 to SR11. Each of the latch circuits 40 to 44 is enabled by the attenuation control signal of the high level supplied to the ACONT terminal 2 to latch the data from the shift-register 39. Consequently, one of the switches 35-10 to 35-20 is changed from on-state to off-state and another of them is inverted from off-state into on-state by the decoder 44 in response to the latched data in the latch circuit 44. Simultaneously, each of the decoders 45 to 47 makes one switch conductive and another switch nonconductive in response to the data supplied thereto. Accordingly, eight switches are subjected to change in the conductive state every time when the attenuation control signal supplied to the ACONT terminal 2 is changed from the low level to the high level.

The attenuation control signal is also supplied to the muting pulse generator 10 which includes four inverters 50, 51, 54 and 56, a NOR circuit 55, a resistor 52, and a capacitor 53. The generator 10 is provided in the external of the integrated circuit device 30, but may be fabricated in the device 30. The inverter 50 is connected between the ACONT terminal 2 and the one input end of the NOR circuit 55. The series connection circuit of the inverter 51, a time constant circuit composed of the resistor 52 and capacitor 53 and the inverter 54 is connected between the ACONT terminal 2 and the other input end of the NOR circuit 55. The output end of the NOR circuit 55 is connected to the MUTE terminal 57 through the inverter 56 to produce the muting pulse MP. Accordingly, the muting pulse MP is inverted from a high level to a low level in synchronism with the invertion from the low level to the high level of the attenuation control signal supplied to the ACONT terminal 2. The low level period of the muting pulse MP is determined by the time constant circuit composed of the resistor 52 and capacitor 53.

Therefore, the switches 35-20 and 36-20 are turned on simultaneously with the change in conductive states of eight switches. As a result, the OUTL and OUTR terminals 7-1 and 7-2 which would be otherwise subjected to a large potential variation shown by dotted line in FIG. 6 are clamped to the ground potential.

In FIG. 5, the switching control signals $C_{L11}'$ and $C_{R11}'$ may control the switches 35-9 and 36-9, respectively. The buffer amplifiers 31 and 32 may be formed in the device 30.

As described above in detail, the digital controlled signal attenuater (or digital controlled volume attenuater) according to the present invention presents the switching noise caused by the change in conductive state of at least one switch from being supplied to the signal output terminal.

The present invention is not limited to the above-mentioned embodiments, but can be modified other circuit construction without departing from the scope and spirit of the present invention. For example, the resistor 15 in FIG. 1 and the resistors 37 and 38 in FIG. 5 may be made of a MOS transistor having a front-gate supplied with a fixed potential and a back-gate connected to its source or drain. The circuit described above is employed for controlling the attenuation volume, but may be used for changing the recording level and/or a playback level in a tape recorder.

What is claimed is:

1. A circuit comprising an input terminal supplied with an input signal, a reference terminal supplied with a reference potential, a plurality of resistors connected in series between said input terminal and said reference terminal, a plurality of first electronic switches each having one end connected to a different one of the connection points among said resistors, the other ends of said first electronic switches being connected in common, a control circuit for making one of said first electronic switches conductive, an output terminal, means for coupling the common connection point of said first electronic switches to said output terminal, a second electronic switch coupled between said output terminal and said reference terminal, and means for controlling said second electronic switch to turn said second electronic switch on when one of said first electronic switches is changed from the conductive state to the non-conductive state while another of said first electronic switches is, in turn, changed from the nonconductive state to the conductive state.

2. The circuit as claimed in claim 1, wherein each of said first and second electronic switches includes two insulated gate field effect transistors of different conductivity types connected in parallel.

3. A circuit comprising a signal input terminal supplied with an input signal, means responsive to said input signal for producing a plurality of signals each relative to said input signal, a signal output terminal, at least one data terminal supplied with switching data, a control terminal supplied with a control signal, means for storing said switching data in response to said control signal, a decoder for decoding the data stored in said storing means, means responsive to said control signal for generating a muting pulse, electronic switching means responsive to an output of said decoder for switching a signal to be outputted from one of said signals to another of said signals to supply said another of said signals to said signal output terminal, said electronic switching means generating a switching noise at a transition time when the signal to be outputted is switched from said one signal to said another signal, and means connected between said switching means and said signal output terminal and responsive to said muting pulse for preventing said switching noise from appearing at said signal output terminal.

4. The circuit as claimed in claim 3, wherein said producing means includes a plurality of impedance means connected in series to produce said plurality of signals from the respective connection points of said impedance means.

5. The circuit as claimed in claim 3, wherein said electronic switching means includes a plurality of electronic switching circuits each having one end supplied with a different one of said plurality of signals, the other ends of said electronic switching circuits being connected in common.

6. The circuit as claimed in claim 5, wherein said preventing means includes a muting switch connected between said signal output terminal and a reference potential point, said muting switch and one of said electronic switching circuits are made conductive at a substantially same time.

7. A circuit comprising a string of resistance elements connected between a signal input terminal and a reference potential point, a first switching element having one end connected to a first connection point in said string of resistance elements, a second switching element having one end connected to a second connection point in said string of resistance elements, said first and second switching elements further having the other ends connected in common to a node, means responsive to a control signal for making either one of said first and second switching means conductive, means for connecting said node to said signal output terminal, and means responsive to said control signal for clamping a potential at said signal output terminal to a potential at said reference potential point at a transition time when one of said first and second switching elements is changed from a non-conductive state to a conductive state.

8. The circuit as claimed in claim 7, wherein said clamping means includes a third switching element connected between said signal output terminal and said reference potential point and a pulse generator generating a pulse signal in response to said control signal, said third switching element is made conductive in response to said pulse signal.

9. The circuit as claimed in claim 8, wherein each of said first and second switching elements includes first and second field effect transistors connected in parallel with each other and a back-gate control circuit controlling the potential of the back-gate of at least one of said first and second transistors, and said third switching elements includes third and fourth field effect transistors connected in parallel with each other.

10. A circuit comprising an input terminal supplied with an input signal, a reference terminal supplied with a reference potential, a plurality of resistors connected in series between said input terminal and said reference terminal, a plurality of electronic switches each having one end connected to different one of the connection points among said resistors, the other ends of said electronic switches being connected in common, a control circuit making either one of said electronic switches conductive, each of said electronic switches generating a switching noise when made conductive, an output terminal, and a muting circuit supplying a signal transmitted through either one of said electronic switches to said output terminal and preventing said switching noise from being supplied to said output terminal.

\* \* \* \* \*